United States Patent [19]

Vancu

[11] Patent Number: 5,029,131

[45] Date of Patent: Jul. 2, 1991

[54] FAULT TOLERANT DIFFERENTIAL MEMORY CELL AND SENSING

[75] Inventor: Radu M. Vancu, San Jose, Calif.

[73] Assignee: SEEQ Technology, Incorporated, San Jose, Calif.

[21] Appl. No.: 212,975

[22] Filed: Jun. 29, 1988

[51] Int. Cl.$^5$ .............................................. G11C 11/34
[52] U.S. Cl. .................................. 365/185; 365/200; 365/207
[58] Field of Search ............... 365/185, 184, 200, 207, 365/208; 307/473

[56] References Cited

U.S. PATENT DOCUMENTS 4,685,086  8/1987  Tran ................................. 365/200 X
4,768,169  8/1988  Perlegos ........................... 365/184 X

FOREIGN PATENT DOCUMENTS 0136170  3/1985  European Pat. Off. ............ 365/185

Primary Examiner—Aristotelis M. Psitos
Assistant Examiner—Andrew L. Sniezek
Attorney, Agent, or Firm—Kenneth D'Alessandro

[57] ABSTRACT

A fault tolerant memory and method for sensing is disclosed. A pair of memory cells each including a memory device and a select device are connected to a pair of bit lines. The bit lines are connected through select devices to a differential sense amplifier. Each pair of memory cells stores a single bit of data; the first memory cell stores the data bit and the second memory cell stores the compliment of the data bit. The memory cells are fabricated such that they exhibit three states; a first state in which they conduct current, a second state in which they do not conduct current, and a third, abnormal, state into which they fail wherein they conduct approximately half of the current which would be conducted in the first state.

6 Claims, 1 Drawing Sheet

|  | D | D̄ |  | D | D̄ |
|---|---|---|---|---|---|
| NORMAL | 0 | i |  | i | 0 |
| FAILURE | i/2 | i |  | i/2 | 0 |
| FAILURE | 0 | i/2 |  | i | i/2 |
|  | ONE |  |  | ZERO |  |

FAULT TOLERANT DIFFERENTIAL MEMORY CELL AND SENSING

BACKGROUND OF THE INVENTION

1. Field Of The Invention

The present invention relates to user-programmable memories, particularly, electrically erasable programmable read-only memories (EEPROMS). More particularly, the present invention relates to the combination of a high reliability cell and a differential sensing of that cell.

2. The Prior Art

Differential sensing of memory cells is known. It has been utilized in static random access memories, dynamic random access memories and other memory products.

BRIEF DESCRIPTION OF THE INVENTION

In the present invention, two memory cells, each cell including a floating gate EEPROM transistor and a select transistor, are utilized per bit of information to be stored. The first memory cell is connected through its select device to its bit line. The second memory cell is connected through its select device to a complimentary bit line. The bit line and the complimentary bit line are connected to a data bus and a complimentary data bus through Y-select devices. A differential sense amplifier is connected to the data bus and the complimentary data bus.

The EEPROM transistors used in the present invention are fabricated using a special depletion cell implants which control their failure mode conduction level. This depletion implant is such that a failed memory cell conducts approximately half of the current that a normal cell conducts when it is in is conductive state, i.e., storing a logic zero.

DETAILED DESCRIPTION OF A PREFERRED EMBODIMENT

Figures 1, 2:
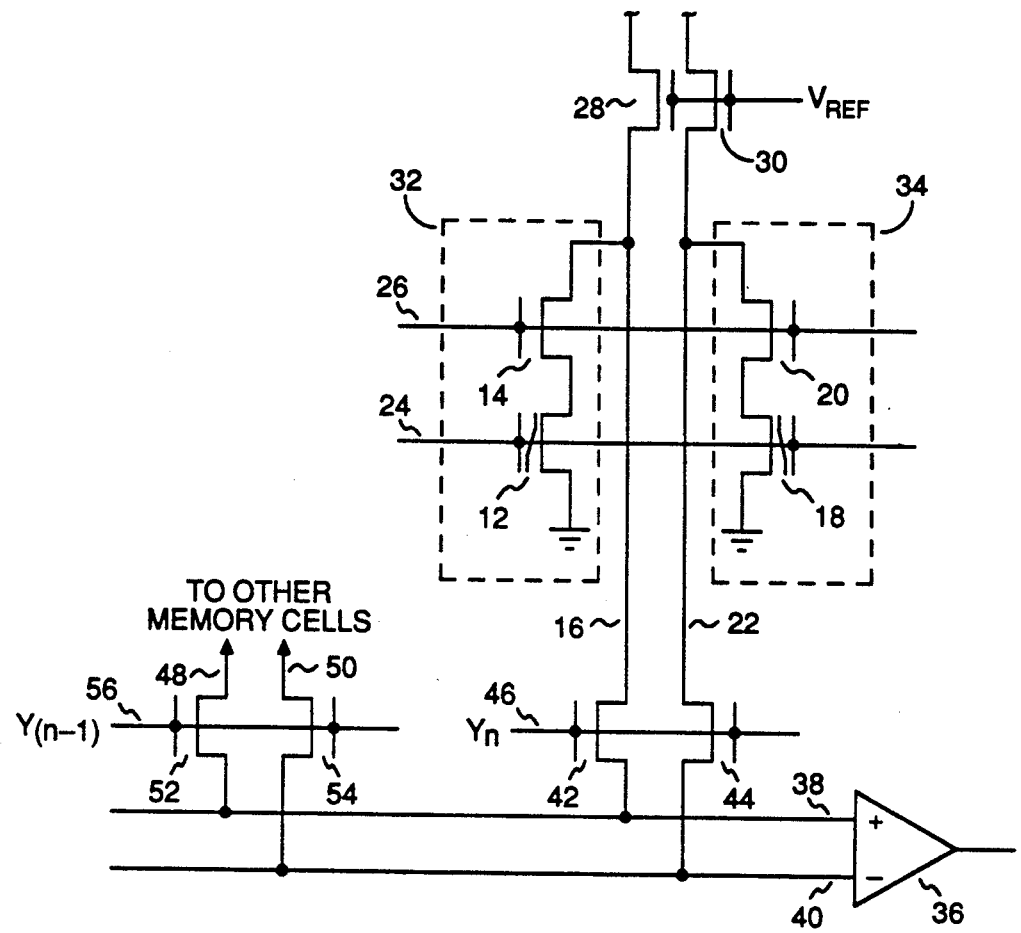
FIG. 1 is a schematic diagram of an embodiment of the present invention showing two EEPROM memory cells connected through their selected devices to a differential sense amplifier.
FIG. 2 is a table showing the current output from the memory cells for both normal and failure modes.

Referring first to FIG. 1, a first EEPROM transistor 12 has its source connected to Vss, a source of negative voltage, and its drain connected to the source of select transistor 14. Select transistor 14 has its drain connected to bit line 16. A second EEPROM memory transistor 18 has its source connected to Vss and its drain connected to the source of a second select transistor 20. The drain of second select transistor 20 is connected to a complimentary bit line 22. The gates of first EEPROM transistor 12 and second EEPROM transistor 18 are connected together to a sense line 24. The gates of first select transistor 14 and second select transistor 20 are connected together to a word line 26. Bit lines 16 and 22 are connected to a source of positive voltage, $V_{dd}$, through load devices 28 and 30 respectively. The drain of N-channel load device 28 is connected to $V_{dd}$ and its source is connected to bit line 16. The drain of N-channel load device 30 is connected to $V_{dd}$ and its source is connected to bit line 22. The gates of both N-channel load devices 28 and 30 are connected together to a source of reference voltage $V_{ref}$, as is known in the art.

Together, first EEPROM transistor 12 and first select device 14 comprise a first memory cell 32. Second EEPROM transistor 18 and second select device 20 together form a second memory cell 34. First memory cell 32 and second memory cell 34 are both used to store a single bit of data. First memory cell 32 stores the data, and second memory cell 34 stores the compliment of the data. For example, if a logic zero is to be stored, first memory cell 32 stores a logic zero and second memory cell 34 stores a logic one. The stored data is read out of first and second memory cells 32 and 34 and sensed by differential sense amplifier 36. The inputs to differential sense amplifier 36 are data bus 38 and complimentary data bus 40. Bit line 16 is coupled to data bus 38 by Y-select device 42, and complimentary bit line 22 is connected to complimentary data bus 40 by a complimentary Y-select device 44. Y-select device 42 and complimentary Y-select device 44 have their gates tied together to Y-select line $Y_n$, shown at reference numeral 46.

Those of ordinary skill in the art will understand in a product made according to the present invention, numerous memory cells like 32 and 34 are connected to bit line 16 and complimentary bit line 22 and each have their own word line like that shown at reference numeral 26. Those of ordinary skill in the art will also understand that other bit line pairs like bit line 16 and complimentary bit line 22 will be coupled to data bus 38 and complimentary data bus 40 through Y-select devices similar to Y-select device 42 and complimentary Y-select device 44. For example, as shown in FIG. 1, bit line 48 and complimentary bit line 50 are connected to data bus 38 and complimentary data bus 40, respectively, through Y-select device 52 and complimentary Y-select device 54. Y-select device 52 and complimentary Y-select device 54 have their gates commonly connected to Y-select line Y(n−1), shown at reference numeral 56.

When it is desired to read the data stored in first memory cell 32 and second memory cell 34 word line 26 is brought high and Y-select line $Y_n$, reference numeral 46, is brought high. If the data bit stored by the pair of memory cells 32 and 34 is a logic zero, memory cell 32 will conduct current which will establish a voltage on bit line 16 because of the presence of load device 28, having its drain connected to a source of positive voltage, its source connected to bit line 16, and its gate connected to a reference voltage $V_{ref}$. Assuming a nominal five volt power supply voltage, a value of $V_{ref}$ of approximately 2.5 volts has been found to be satisfactory.

The voltage on bit line 16 will thus be lowered and will be sensed by sense amplifier 36, via data bus 38, through Y-select device 42, through bit line 16 and select device 14. Memory cell 34 will, in this event, conduct no current from complimentary data bus 40. The voltage on bit line 22 will not drop and will be sensed by sense amplifier 36, through complimentary Y-select device 44 bit line 22 and select device 20. The voltage on bit line 22 is established by load device 44, connected in the same manner as load device 42.

Differential sense amplifier 36 senses the difference between the voltages on its inputs, the voltages on data bus 38 and complimentary data bus 40. Differential sense amplifier 36 may be any differential sense amplifier having a common mode range of at least approximately three volts, assuming a five volt nominal power supply voltage.

Another aspect of the present invention allows data to be successfully read even when one of first memory cell 32 or second memory cell 34 have failed. The sensing of data from this pair of memory cells is made possible even if one of the cells has failed because of the nature of each of memory EEPROM transistor 12 and 18.

Each EEPROM memory cell in the present invention is fabricated using a special depletion implant which assures that when the cell fails it will pass approximately one half of the current which would be past by a normal unfailed cell storing a logic zero. An arsenic implant has been found to be satisfactory for this purpose. For a cell size of 168 micron $_2$ having a gate oxide thickness of 650Å, an implant dose of approximately $8 \times 10^{11}$ atoms/cm$_3$ has been found to be satisfactory. For a cell size of 108 microns$^2$ having a gate oxide thickness of 450Å, an implant dose of approximately $1.25 \times 10^{12}$ atoms/centermeter$_3$ has been found to be satisfactory. Those of ordinary skill in the art will realize that the dosage will depend on the cell size, gate oxide thickness and programming an array sufficiency of the cell and will easily be able to optimize this implant doses for any particular cell configuration. FIG. 2 is a table setting forth the outputs of complimentary memory cells 32 and 34 when a logic one and a logic zero is to be stored, showing the currents drawn by memory cell 32 and memory cell 34 under normal conditions, when cell 32 has failed, and when cell 34 has failed.

According to FIG. 2, when a logic one is to be stored in the pair of cells, memory cell 32 will not conduct any current and memory cell 34 will conduct a current i if both cells are functioning. If however, memory cell 32 has failed, it will conduct a current of i/2 and functioning memory cell 34 will conduct a current i. If, however, memory cell 34 has failed and memory cell 32 is functioning, memory cell 32 will conduct no current and memory cell 34 will conduct i/2 current.

Likewise, when a logic zero is to be stored, memory cell 32 will conduct a current i and memory cell 34 will conduct no current if both cells are functioning. If, however, memory cell 32 has failed, it will conduct a current of i/2 and functioning memory cell 34 will conduct no current. On the other hand, if memory cell 34 has failed, functioning memory cell 32 will conduct a current of i and memory cell 32 will conduct a current of i/2.

The current drawn by memory cells 32 and 34, under the conditions just described will cause differing voltages to appear on bit lines 16 and 22 because of the presence of load devices 28 and 30 respectively. With no current flowing in memory cell 32 or 34, its associated bit line will be maintained at a voltage of approximately 2.5 volts. The reference voltage $V_R$ is adjusted so that with no current flow in the memory cells approximately 2.5 volts will appear on the bit lines. Any current conducted by the cell will drop the voltage on the bit line. Since a failed cell will conduct half the current of a good cell, the failed cell will provide a voltage drop of about half that produced by a good cell. The trip point of differential sense amplifier 36 is designed such that a voltage differential on its two inputs connected to data busses 33 and 40 which is equal to the voltage produced by I/2 on a bit line, will cause the sense amplifier to trip.

While embodiments and applications of this invention have been shown and described, it would be apparent to those skilled in the art that many more modifications are possible without departing from the inventive concepts herein. The invention, therefore, is not to be restricted except in the spirit of the appended claims.

What is claimed is:

1. An electrically erasable, programmable, floating gate memory, including:
    a first memory cell, including a first memory device in series with a first select device, connectable to a first bit line, a second memory cell, including a second memory device in series with a second select device, connectable to a second bit line, said first and second memory cells storing a data bit and its complement, respectively said first and second select devices being simultaneously switchable to connect said first and second memory devices to said first and second bit lines, respectively,
    a differential sense amplifier having a first input and a second input,
    selection means, for selectively connecting said first bit line and said second bit line to said first input and said second input, respectively, of said differential sense amplifier,
    said first and second memory devices having three conductive states, including a first state in which said first and second memory devices conduct a first amount of current when connected to said first and second bit lines through said first and second select devices, respectively, a second state in which said first and second memory devices do not conduct current when connected to said first and second bit lines through said first and second select devices, respectively, and a third state exhibited by said first and second memory devices after they have failed, said first and second memory devices in said third state conducting a second amount of current when connected to said first and second bit lines through said first and second select devices, respectively, said second amount of current approximately equal to half the amount of said first current.

2. The electrically erasable, programmable, floating gate memory of claim 1, wherein said selection means are two Y-select devices, a first Y-select device being connected between said first bit line and said first input of said differential sense amplifier, and said second Y-select device being connected between said second bit line and said second input of said differential sense amplifier, each of said first and second Y-select devices being activated by a single Y-select address line.

3. A method of sensing a data bit from a pair of cells storing said data bit and its complement, respectively in an electrically erasable, programmable, floating gate memory having memory cells which exhibit a first state during which such cells conduct current, a second state during which such cells do not conduct current, and a third, failed, state wherein such cells conduct approximately half as much current as they conduct in said first state, said method including the steps of:
    electrically connecting the first of said pair of cells to a first bit line,
    electrically connecting the second one of said pair of cells to a second bit line,
    electrically connecting said first bit line to the inverting input of a differential sense amplifier, and electrically connecting said second bit line to the non-inverting input of said differential sense amplifier.

4. A circuit for storing and reading a bit of information in an electrically erasable, programmable, floating gate memory, including:
   a first bit line,
   a second bit line,
   a differential sense amplifier having a first input and a second input,
   first selection means, for selectively connecting said first bit line and said second bit line to said first input and said second input, respectively, of said differential sense amplifier,
   a first memory cell,
   a second memory cell,
   second selection means, for selectively connecting said first and said second memory cells to said first and second bit lines, respectively,
   said first and second memory cells having three conductive states, including a first state in which said first and second memory devices conduct a first amount of current when connected to said first and second bit lines, respectively, a second state in which said first and second memory devices do not conduct current when connected to said first and second bit lines, respectively, and a third state, exhibited by said first and second memory devices after they have failed, said first and second memory devices in said third state conducting a second amount of current when connected to said first and second bit lines, respectively, said second amount of current being approximately equal to half the amount of said first current.

5. The electrically erasable, programmable, floating gate memory of claim 4, wherein said first selection means are two word select devices, a first word select device being connected between said first memory cell and said first bit line, and said second word select device being connected between said second memory cell and said second bit line, said first and second word select devices being activated by a single word line.

6. The electrically erasable, programmable, floating gate memory of claim 4, wherein said second selection means are two Y-select devices, a first Y-select device being connected between said first bit line and said first input of said differential sense amplifier, and said second Y-select device being connected between said second bit line and said second input of said differential sense amplifier, each of said first and second Y-select devices being activated by a single Y-select address line.

* * * * *